United States Patent [19]

Bryant et al.

[11] Patent Number: 5,344,790
[45] Date of Patent: Sep. 6, 1994

[54] MAKING INTEGRATED CIRCUIT TRANSISTOR HAVING DRAIN JUNCTION OFFSET

[75] Inventors: Frank R. Bryant, Denton; Robert L. Hodges, Euless, both of Tex.

[73] Assignee: SGS-Thomson Microelectronics, Inc., Carrollton, Tex.

[21] Appl. No.: 114,754

[22] Filed: Aug. 31, 1993

[51] Int. Cl.$^5$ .................................... H01L 21/336
[52] U.S. Cl. .................................... 437/44; 437/41
[58] Field of Search .................................... 437/41, 44

[56] References Cited

U.S. PATENT DOCUMENTS

| | | | |
|---|---|---|---|
| 4,852,062 | 7/1989 | Baker et al. | 437/44 |
| 5,063,172 | 11/1991 | Manley | 437/44 |
| 5,108,935 | 4/1992 | Rodder | 437/44 |
| 5,210,044 | 5/1993 | Yoshikawa | 437/44 |
| 5,258,319 | 11/1993 | Inuishi et al. | 437/44 |

*Primary Examiner*—Brian E. Hearn
*Assistant Examiner*—L. Gurley
*Attorney, Agent, or Firm*—Kenneth C. Hill; Lisa K. Jorgenson; Richard K. Robinson

[57] ABSTRACT

A method for fabricating an integrated circuit transistor begins with forming a gate electrode over an insulating layer grown on a conductive layer. Sidewall spacers are formed alongside vertical edges of the gate electrode and a mask is applied to a drain region. A relatively fast-diffusing dopant is then implanted into a source region in the conductive layer. Thereafter, the mask is removed and the drain region is implanted with a relatively slow-diffusing dopant. Finally, the conductive layer is annealed, causing the relatively fast-diffusing dopant to diffuse beneath the source sidewall spacer to a location approximately beneath the vertical edge of the source side of the gate electrode, and causing the relatively slow-diffusing dopant to extend beneath the drain sidewall spacer a lesser distance, so that the drain junction is laterally spaced from underneath the gate electrode. Due to the difference in diffusion rates between the relatively slow-diffusing dopant and the relatively fast-diffusing dopant, a transistor having a drain junction offset is formed.

9 Claims, 1 Drawing Sheet

MAKING INTEGRATED CIRCUIT TRANSISTOR HAVING DRAIN JUNCTION OFFSET

BACKGROUND OF THE INVENTION

1. Field of the Invention

The present invention is related generally to integrated circuits, and more specifically to a new device structure and process for preparing field effect transistors (FETs) having a drain junction offset.

2. Description of the Prior Art

Within microelectronic integrated circuits, transistors are used to perform many different functions. For example, within static random access memory (SRAM) devices, transistors are used to form memory cells to store bits of data. Within such memory cells, some transistors are used to actively pull-up the output of the memory cell.

The electrical characteristics of such an active pull-up transistor are important to the design and fabrication of multimegabit memory devices. One characteristic important in the design of such active pull-up transistors is the subthreshold leakage, or "off" current, which passes through the transistor when the transistor is biased in an "off" state. Transistors having a low subthreshold leakage current are desirable because they reduce power consumed while the memory device is in the standby mode.

In the design and manufacture of thin film transistors (TFTs), a drain junction offset is desirable to reduce such subthreshold leakage current. A drain junction offset exist when the drain junction is not located beneath the gate electrode, but instead is located a selected distance away from a point beneath the edge of the gate electrode.

In contrast, a source offset is not desirable because a source offset will reduce the transistor's on current.

Although self-aligned techniques to produce drain junction offset are known, they require excessive photo and etch steps to build a drain offset without a source offset.

SUMMARY OF THE INVENTION

Therefore, according to the present invention, a method for fabricating an integrated circuit transistor begins with forming a gate electrode over an insulating layer grown on a conductive layer. Sidewall spacers are formed alongside vertical edges of the gate electrode and a mask is applied to a drain region. A relatively fast-diffusing dopant is then implanted into a source region in the conductive layer. Thereafter, the mask is removed and the drain region is implanted with a relatively slow-diffusing dopant. Finally, the conductive layer is annealed, causing the relatively fast-diffusing dopant to diffuse beneath the source sidewall spacer to a location approximately beneath the vertical edge of the source side of the gate electrode, and causing the relatively slow-diffusing dopant to extend beneath the drain sidewall spacer a lesser distance, so that the drain junction is laterally spaced from underneath the gate electrode. Due to the difference in diffusion rates between the relatively slow-diffusing dopant and the relatively fast-diffusing dopant, a transistor having a drain junction offset is formed.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
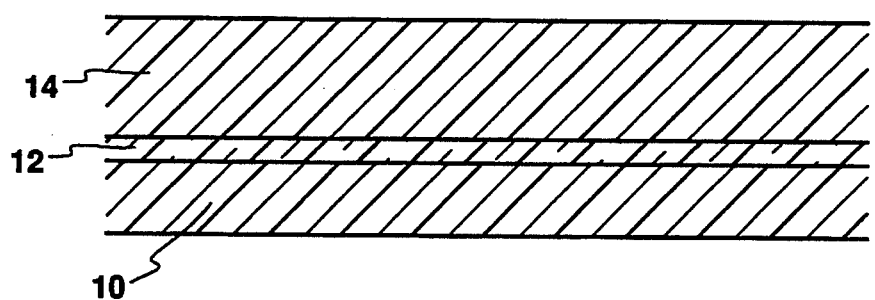
FIGS. 1–4 illustrate one preferred method for forming integrated circuit structures according to the present invention.

Referring to FIG. 1, a polysilicon layer 10 is used for the formation of thin film transistor (TFT) devices. A threshold adjust implant may be made in the polysilicon layer 10 if desired. A portion of polysilicon layer 10 is converted to gate oxide 12 during a thermal oxidation step known in the art. Gate oxide layer 12 is preferably approximately 50 to 1000 angstroms thick. A polycrystalline silicon layer 14 is then deposited over the entire device.

Figure 2:
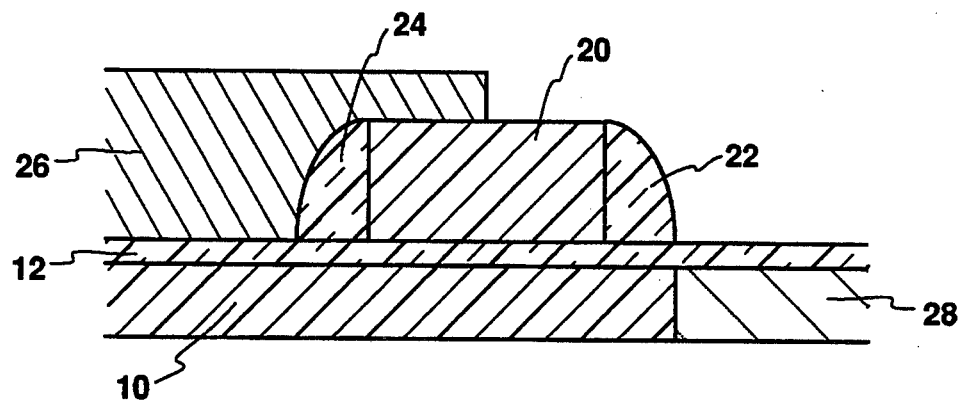

Referring to FIG. 2, polycrystalline silicon layer 14 is then patterned, as known in the art, to form a polycrystalline silicon gate electrode 20. If desired, polycrystalline silicon layer 14 may be doped before gate electrode 20 is formed, and gate electrode 20 can be formed to include a refractory metal silicide to improve conductivity. Such techniques are well known in the art.

After gate electrode 20 is formed, a source sidewall spacer 22 and a drain sidewall spacer 24 are formed using techniques that are well known in the art of semiconductor device fabrication. Source sidewall spacer 22 and drain sidewall spacer 24 may be formed from silicon dioxide.

Next, a mask 26, typically a photoresist layer, is applied to the drain side of gate oxide 12, drain sidewall spacer 24, and gate electrode 20. After mask 26 has been applied and patterned, a dopant, having a relatively fast diffusion rate, is implanted into polycrystalline silicon layer 10 using any technique well known in the art. Such dopant having a relatively fast diffusion rate is preferably boron, for a p-channel transistor. The boron implanting step forms a source region 28.

Figure 3:
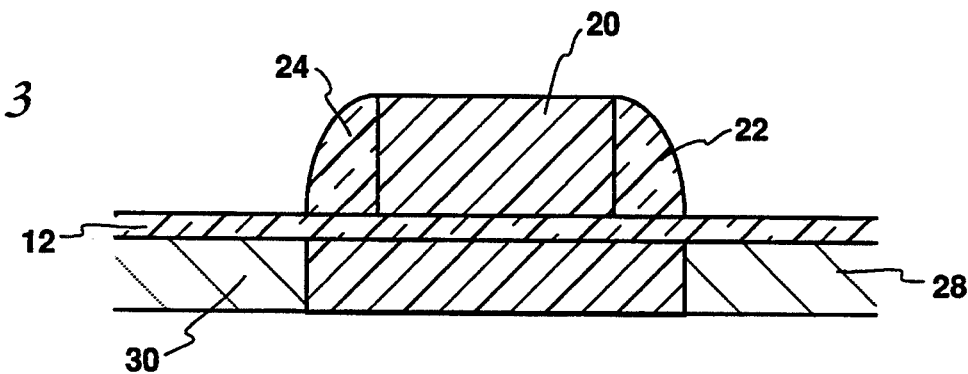

Referring to FIG. 3, mask 26 is removed, and a dopant, having a relatively slow diffusion rate, is implanted into polycrystalline silicon layer 10 to form a drain region 30. In a preferred embodiment of the present invention, for a p-channel device, such a relatively slow-diffusing dopant is indium. Source sidewall spacer 22, drain sidewall spacer 24, and gate electrode 20 mask portions of polysilicon layer 10 during such an implanting process. The second implant also enters the source region 28. Assuming the doping levels of the two implants to be approximately equal, the source is doped to a level approximately twice that of the drain.

Figure 4:
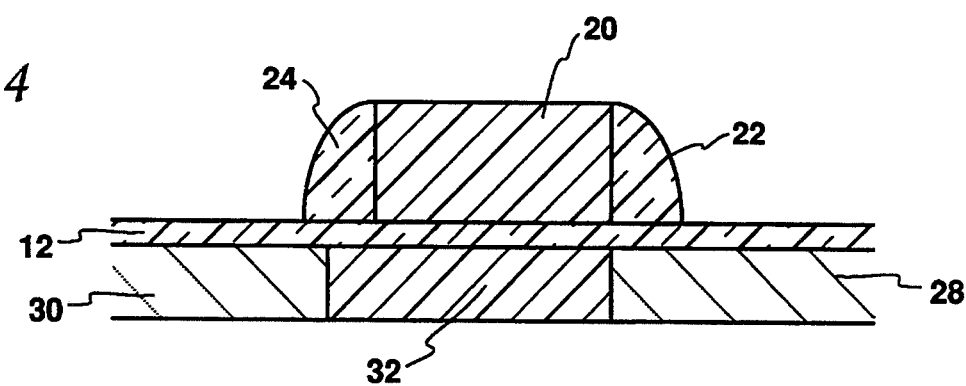

Referring to FIG. 4, source region 28 and drain region 30 are allowed to diffuse into a channel region 32 during a high temperature anneal process. The temperature of the anneal process is preferably 850°–900° C. During such a high temperature step, both source region 28 and drain region 30 will diffuse into channel region 32, however source region 28 will diffuse into channel region 32 at a rate greater than the rate at which drain region 30 diffuses into channel region 32. Such difference in diffusion rates between source region 28 and drain region 30 is due to the fact that source region 28 has been implanted with a fast-diffusing dopant compared to the slow-diffusing dopant implanted in drain region 30.

In a preferred embodiment, the diffusion rate of the dopant implanted in source region 28 is greater than two times the diffusion rate of the dopant implanted within drain region 30. Such is the case with the preferred dopants boron and indium. Consequently, when source region 28 has diffused beneath source sidewall spacer 22 to a location beneath the source edge of electrode 20, drain region 30 will have extended less than half way beneath drain spacer 24, thereby producing a field effect transistor having a drain junction offset. Such a drain junction offset reduces the subthreshold leakage current of the transistor. As shown in FIG. 4, source region 28 extends to a point approximately beneath the source edge of gate electrode 20, producing a transistor having no source junction offset. A source junction offset reduces on current, and is therefore not desirable.

As an alternative to forming the transistor on a layer of polycrystalline silicon, the structure of the transistor of the present invention may be formed in a monocrystalline silicon substrate. As an alternative to the p-type dopants boron and indium, n-type dopants may also be used. For example, phosphorous may be used as a relatively fast-diffusing n-type dopant, and either arsenic or antimony may be used as a relatively slow-diffusing n-type dopant. Such fast and slow pairs of dopants will typically have diffusion rates that differ by a factor greater than two.

Various additional modifications are comprehended by the present invention. For example, the gate oxide can be deposited instead of grown, or may be formed from a combination of deposition/thermal growth. The described technique produces a source doped at a higher level due to the double implant made into the source. If this is undesirable, the source can be masked when the slow-diffusing dopant is implanted. The dopants can be implanted in any order.

Because of the self-alignment provided by the gate and sidewalls, the drain mask for the fast-diffusing dopant implant has non-critical alignment, easing design tolerances. The sidewall thickness, combined with the anneal time, determines the final junction locations. Because the overall thermal budget for the device may limit anneal times, the sidewall thickness can be chosen to result in the desired junction placement.

As will be appreciated by those skilled in the art, the technique described above results in a transistor having a drain junction offset for reducing the subthreshold off current of the transistor. Additionally, the transistor fabrication process is self-aligning, and produces no source junction offset.

While the invention has been particularly shown and described with reference to a preferred embodiment, it will be understood by those skilled in the art that various changes in form and detail may be made therein without departing from the spirit and scope of the invention.

What is claimed is:

1. A method for forming an integrated circuit device, comprising the steps of:
   forming a gate insulating layer over a conductive layer;
   forming a gate electrode over the gate insulating layer;
   forming a source sidewall spacer and a drain sidewall spacer alongside opposite vertical edges of the gate electrode;
   forming a mask over a drain region in the conductive layer;
   implanting a relatively fast-diffusing dopant into a source region in the conductive layer;
   removing the mask;
   implanting a relatively slow-diffusing dopant into the drain region; and
   annealing the conductive layer causing the relatively fast-diffusing dopant and the relatively slow-diffusing dopant to diffuse into the conductive layer, producing a drain junction offset in the integrated circuit device.

2. The method of claim 1 wherein the conductive layer comprises monocrystalline silicon.

3. The method of claim 1 wherein the conductive layer comprises polycrystalline silicon.

4. The method of claim 1 wherein the relatively fast-diffusing dopant comprises boron, and wherein the relatively slow-diffusing dopant comprises indium.

5. The method of claim 1 wherein the relatively fast-diffusing dopant comprises phosphorus, and wherein the relatively slow-diffusing dopant comprises arsenic.

6. The method of claim 1 wherein the relatively fast-diffusing dopant comprises phosphorus, and wherein the relatively slow-diffusing dopant comprises antimony.

7. The method of claim 1 wherein the relatively fast-diffusing dopant has an associated fast diffusion rate that is at least twice an associated slow diffusion rate associated with the relatively slow-diffusing dopant.

8. The method of claim 1 wherein the step of implanting a relatively slow-diffusing dopant into the drain region further comprises implanting a relatively slow-diffusing dopant into the drain region and the source region.

9. The method of claim 1 wherein the step of annealing the conductive layer causes the relatively fast-diffusing dopant to extend beneath the source sidewall spacer to a location approximately beneath the vertical edge of the source side of the gate electrode, and causes the relatively slow-diffusing dopant to extend beneath the drain sidewall spacer a distance that is less than approximately half the width of the drain sidewall spacer.

* * * * *